(12) United States Patent
Kawahara et al.

(10) Patent No.: US 7,075,488 B2
(45) Date of Patent: Jul. 11, 2006

(54) ANTENNA STRUCTURE

(75) Inventors: Takao Kawahara, Gunma (JP); Seiji Go, Gunma (JP); Yasuhiro Minoura, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 10/950,430

(22) Filed: Sep. 28, 2004

(65) Prior Publication Data

US 2005/0068235 A1   Mar. 31, 2005

(30) Foreign Application Priority Data

Sep. 29, 2003  (JP)  .............. P2003-338500

(51) Int. Cl.
*H01Q 1/24* (2006.01)

(52) U.S. Cl. ............... 343/702; 343/895; 343/906

(58) Field of Classification Search ......... 343/700 MS, 343/702, 895, 715, 900, 906
See application file for complete search history.

(56) References Cited

U.S. PATENT DOCUMENTS

| 6,034,650 A | * | 3/2000 | Kuramoto | .................... 343/895 |
| 6,166,697 A | | 12/2000 | Granqvist et al. | .......... 343/702 |
| 6,172,656 B1 | * | 1/2001 | Ohwada et al. | ............. 343/895 |
| 6,292,156 B1 | * | 9/2001 | Openlander | ................. 343/895 |
| 6,459,916 B1 | * | 10/2002 | Suguro | .................... 455/575.7 |

FOREIGN PATENT DOCUMENTS

| FR | 2 736 214 A1 | 1/1997 |
| WO | WO 01/24311 A1 | 4/2001 |
| WO | WO 02/080304 A1 | 10/2002 |

* cited by examiner

*Primary Examiner*—Shih-Chao Chen
(74) *Attorney, Agent, or Firm*—Morgan, Lewis & Bockius LLP

(57) ABSTRACT

An insulative member is formed with a hole. An antenna element is provided as a conductive foil adhered onto the insulative member and having a contact section opposing to the hole. A conductive member is fitted into the hole through the contact section of the antenna element, such that a part of the contact section is clamped between an outer face of the conductive member and an inner face of the hole.

18 Claims, 11 Drawing Sheets

FIG. 3
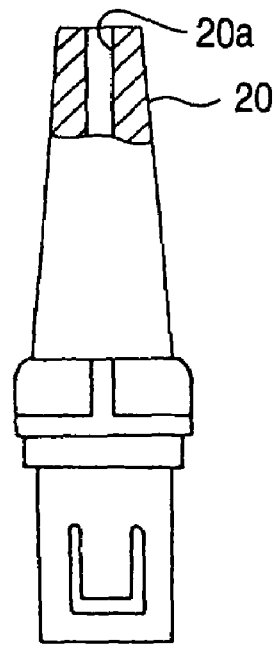
FIG. 4A   FIG. 4B
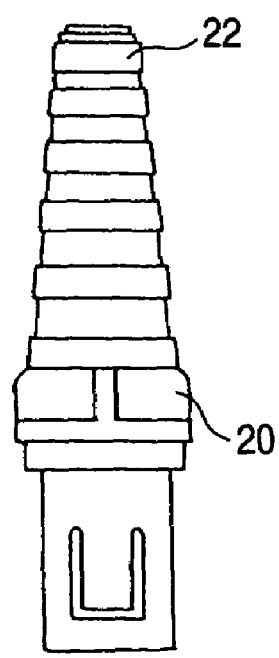
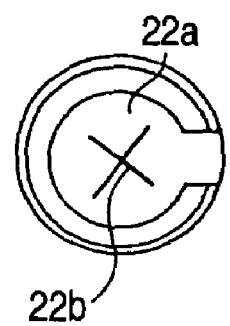

ANTENNA STRUCTURE

BACKGROUND OF THE INVENTION

The present invention relates to an antenna structure comprising an antenna element formed of a conductive foil.

A first example of a related-art antenna structure will be described with reference to FIGS. 14A to 14D.

In this example, an antenna element 10 is formed of sheet material having elasticity such as brass and phosphor bronze, having a thickness of 0.1 to 0.2 mm, and arranged on an outer peripheral face of a core member 12 to be appropriately fixed by adhesion or the like. In an electrical contact part 10a of the antenna element 10, a slit 10b is formed by cutting, as shown in FIG. 14B. The core member 12 is provided with a conductive pin 12a projecting so as to be opposed to the slit 10b to be press-fitted thereinto as shown in FIG. 14C. Since the antenna element 10 is formed of the sheet material having elasticity, the conductive pin 12a is elastically clamped by the slit 10b, so that the antenna element 10 is electrically connected to the conductive pin 12a. The antenna element 10 is appropriately supplied with power by way of this conductive pin 12a.

In this example, in a case where the outer peripheral face of the core member 12 has a truncated conical shape or a cylindrical shape, edges of the antenna element 10 are liable to peel off from the outer peripheral face because of elasticity of the antenna element itself, as shown in FIG. 14D, even though the antenna element 10 has been adhered along the outer peripheral face. In such a case, the property of the antenna may change.

A second example of the related-art antenna structure will be described with reference to FIGS. 15A and 15B. This example is proposed to overcome the above inconvenience.

As shown in FIG. 15A, an antenna element 14 formed of a conductive foil made of a copper foil having a thickness of 0.04 mm is provided with an aperture 14b in a section to be an electrical contact part 14a. As shown in FIG. 15B, the conductive pin 12a projected from the core member 12 is inserted into the aperture 14b, so that electrical connection is established between this conductive pin 12a and the electrical contact part 14a by soldering 16.

However, not only the annoying soldering work is required, but also there is a probability that electrical connection of the antenna element 14 may become unstable if there is a defect in the soldering part 16.

SUMMARY OF THE INVENTION

It is therefore an object of the invention to provide an antenna structure in which electrical connection of an antenna element formed of a conductive foil can be reliably established employing a simple process.

In order to achieve the above object, according to the invention, there is provided an antenna, comprising:

an insulative member, formed with a hole;

an antenna element, provided as a conductive foil adhered onto the insulative member and having a contact section opposing to the hole; and a conductive member, fitted into the hole through the contact section of the antenna element, such that a part of the contact section is clamped between an outer face of the conductive member and an inner face of the hole.

According to the invention, there is also provided a method of manufacturing an antenna, comprising steps of:

providing an insulative member formed with a hole;

adhering an antenna element having a contact section onto the insulative member such that the contact section opposes to the hole;

folding a part of the contact section of the antenna element into the hole; and fitting a conductive member into the hole through the contact section of the antenna element, such that the part of the contact section is clamped between an outer face of the conductive member and an inner face of the hole.

With the above configuration, the electric power is supplied to the antenna element by way of the conductive member. Since the part of the contact section of the antenna element is clamped between the outer face of the conductive member and the inner face of the hole, reliable conduction between the conductive member and the antenna element can be attained by the simple fitting operation of the conductive member without requiring the annoying soldering work.

BRIEF DESCRIPTION OF THE DRAWINGS

The above objects and advantages of the present invention will become more apparent by describing in detail preferred exemplary embodiments thereof with reference to the accompanying drawings, wherein:

FIG. 3 is a partial section view of a core member in the antenna structure of FIG. 1;

FIG. 4A is a side view of the antenna structure of FIG. 1;

FIG. 4B is a top view of the antenna structure of FIG. 1;

DETAILED DESCRIPTION OF THE INVENTION

A first embodiment of the invention will be described below in detail with reference to FIGS. 1 to 6.

Figure 2A:
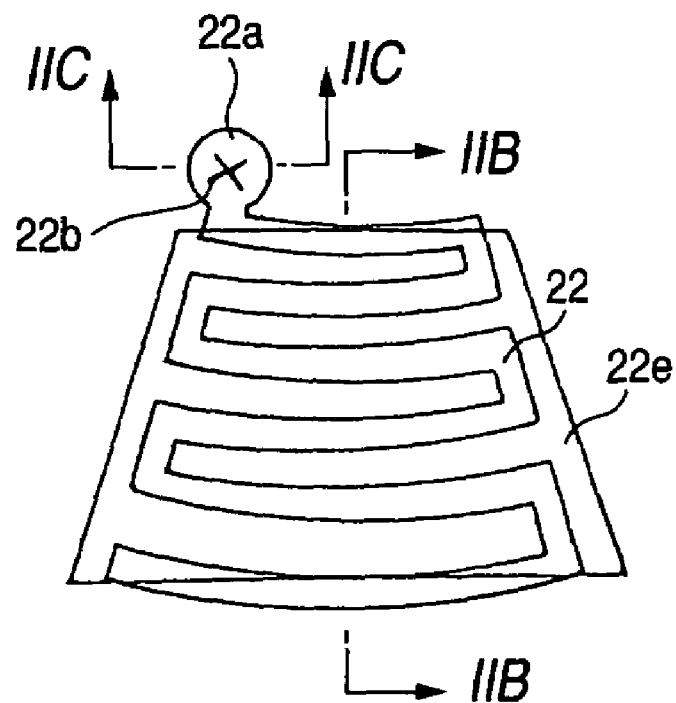
FIG. 2A is an expanded plan view of an antenna element in the antenna structure of FIG. 1.
Figure 2B:
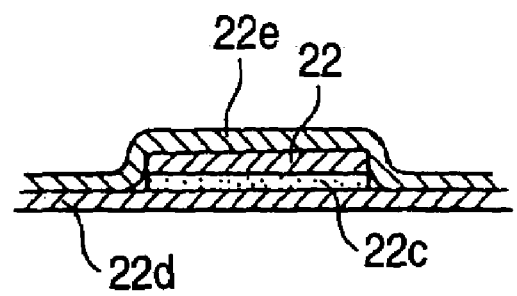
FIG. 2B is a section view taken along a line IIB—IIB in FIG. 2A.
Figure 2C:
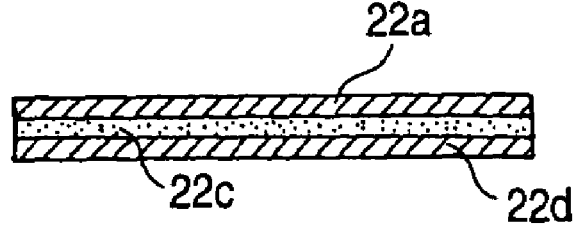
FIG. 2C is a section view taken along a line IIC—IIC in FIG. 2A.

A core member 20 formed of insulating resin or the like has an outer peripheral face substantially in a truncated conical shape, as shown in FIG. 3, to which an antenna element 22 is adapted to be adhered and fixed. The core member 20 is provided with a hole 20a passing through in an axial direction from a distal end face thereof. The antenna element 22 is formed of a conductive foil made of a copper foil having a thickness of about 0.04 mm. As shown in FIG. 2A, the antenna element 22 has an electrical contact part 22a at its one end, and a central part of the electrical contact part 22a is formed with two slits 22b intersecting at a right angle. An adhesive layer 22c is provided on a back face of the antenna element 22, and further, a pasteboard 22d is provided so as to cover the adhesive layer 22c. In addition, a cover tape 22e is provided on a surface of the antenna element 22 except at least the electrical contact part 22a, as shown in FIGS. 2B and 2C.

Figure 1:
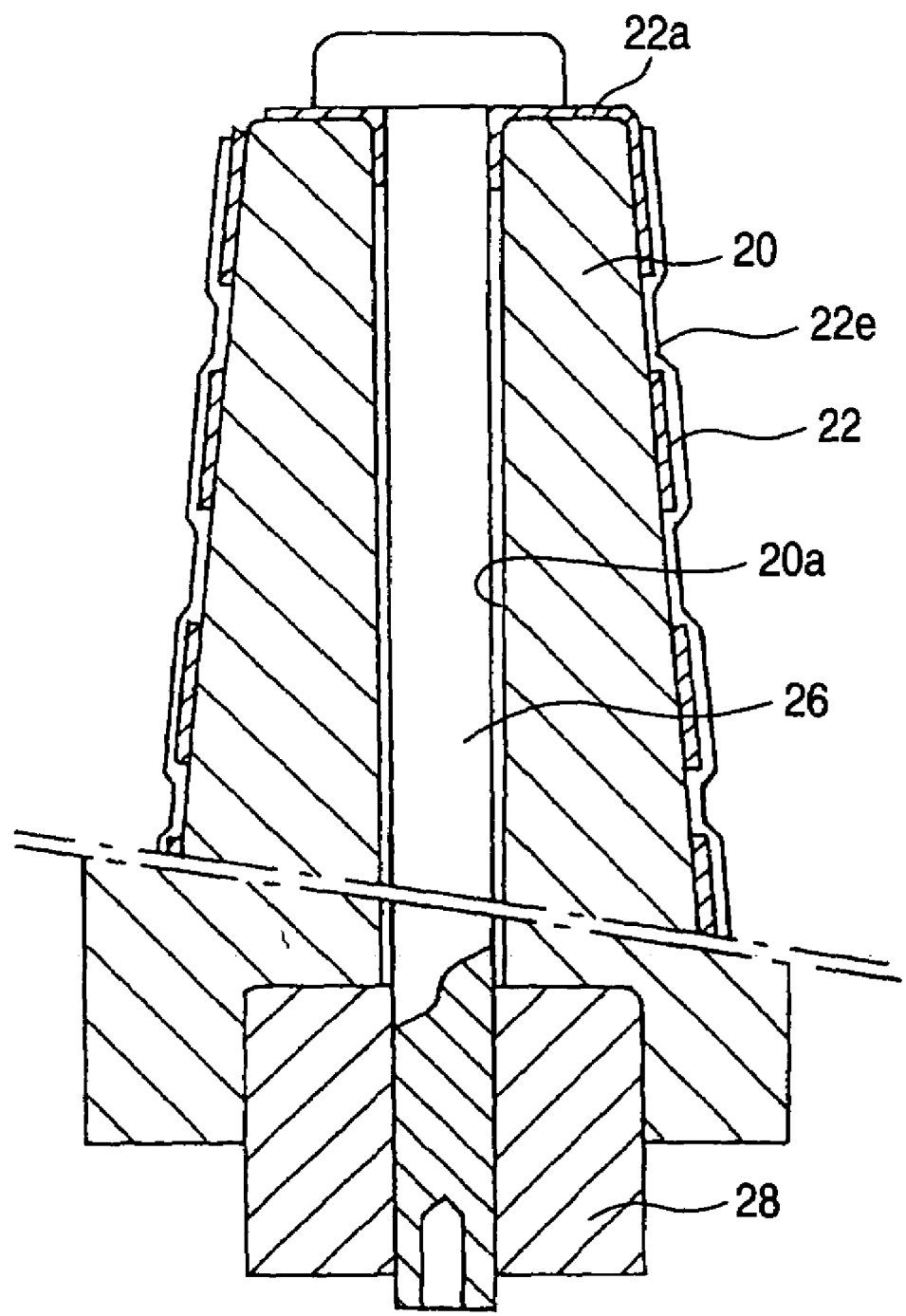
FIG. 1 is a vertical sectional view of an antenna structure according to a first embodiment of the invention.

It is to be noted that an adhesive layer 22c is omitted in FIG. 1, and the adhesive layer 22c and the cover tape 22e are omitted in FIG. 5.

Figure 5A:
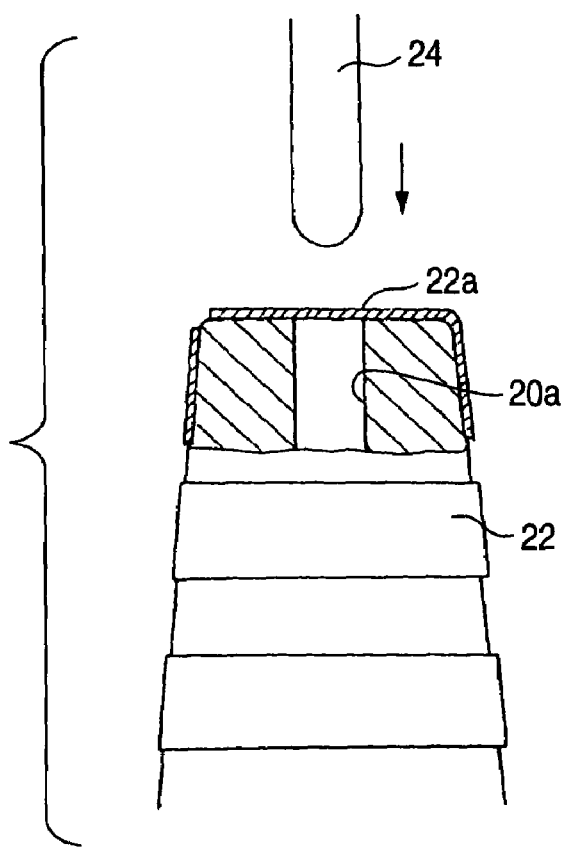
FIGS. 5A to 6 are views for explaining how to establish the electrical connection to the antenna element of FIG. 1.
Figure 5B:
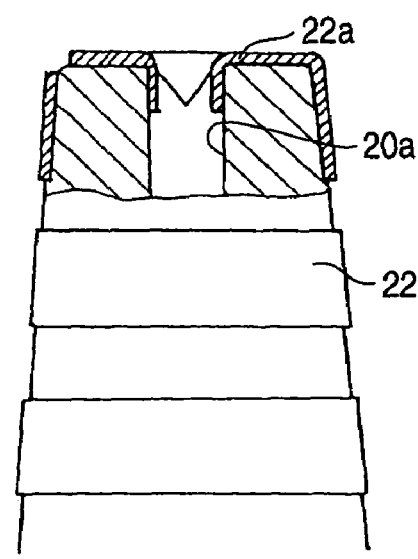
Figure 6:
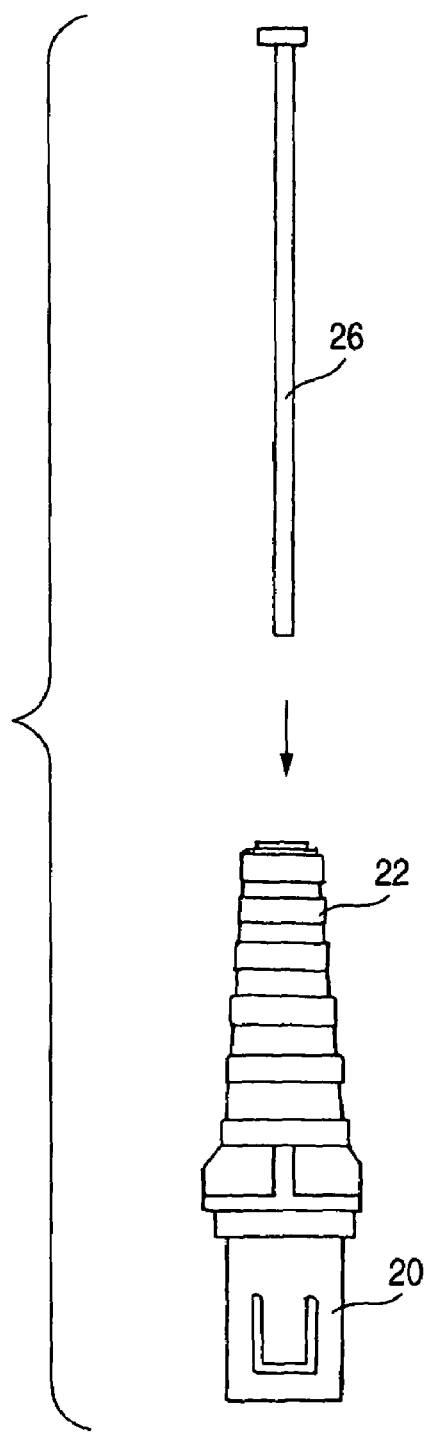

As a first step, the pasteboard 22d is removed, and the antenna element 22 is adhered and fixed to the core member 20, as shown in FIGS. 4A and 4B. On this occasion, the electrical contact part 22a is adhered to the distal end face of the core member 20 in such a manner that the electrical contact part 22a covers an opening end of the hole 20a of the core member 20, and the slits 22b are opposed to the hole 20a. Further, as shown in FIG. 5A, a portion around the slits 22b of the electrical contact part 22a is folded into the hole 20a with a jig 24, and the folded portion is made to be adhered to an inner peripheral face of the hole 20a into a state shown in FIG. 5B. Thereafter, a conductive pin 26 is press-fitted into the hole 20a from the distal end face, as shown in FIG. 6.

Accordingly, as shown in FIG. 1, the portion of the electrical contact part 22a which has been folded into the hole 20a is clamped between the inner peripheral face of the hole 20a and the conductive pin 26. The electrical contact part 22a is not provided with the cover tape 22e on the surface thereof, but directly press-fitted to the conductive pin 26, thereby to establish the electrical connection. An inserted tip end of the conductive pin 26 is appropriately calked with a power supply terminal 28 at a base end of the core member 20 to establish the electrical connection. This power supply terminal 28 is electrically connected to an electric circuit inside a casing body, which is not shown.

In the antenna structure having the above described structure, the conductive pin 26 is press-fitted to the antenna element 22 by clamping the antenna element 22, thereby to obtain the reliable electrical connection. Accordingly, the electrical connection of the antenna element 22 formed of the conductive foil can be established without necessity of the annoying work such as the soldering.

Figure 7:
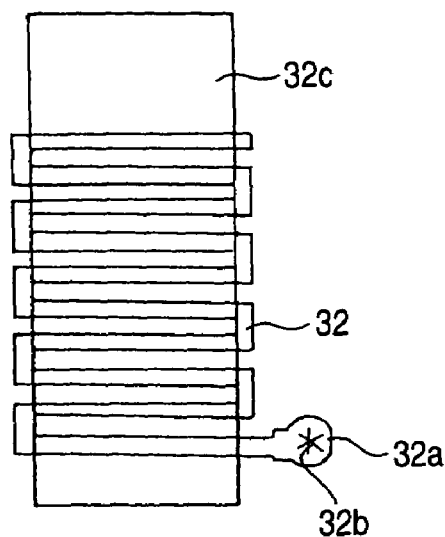
FIG. 7 is an expanded plan view of an antenna element in an antenna structure according to a second embodiment of the invention.
Figure 8A:
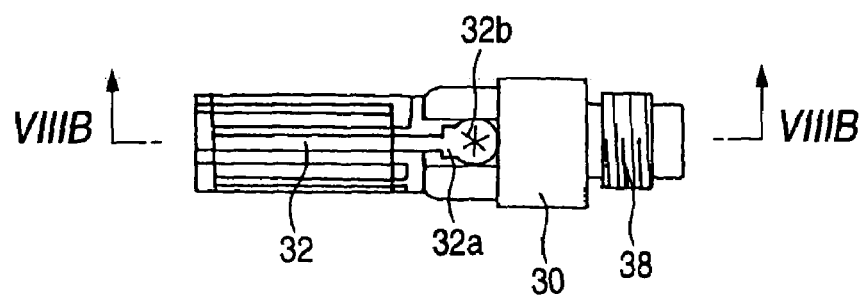
FIG. 8A is a side view of the antenna structure of FIG. 7.
Figure 8B:
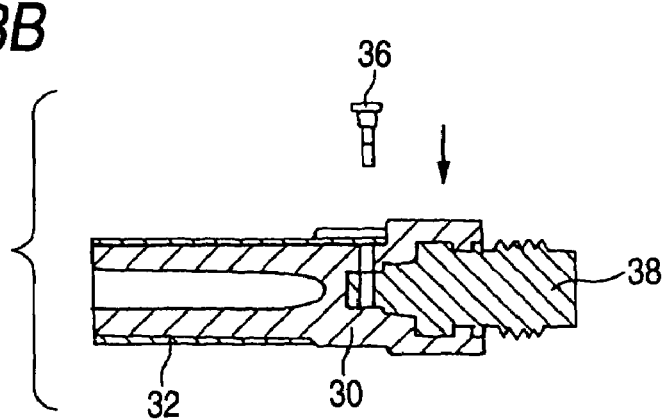
FIG. 8B is a section view taken along a line VIIIB—VIIIB in FIG. 8A.
Figure 9:
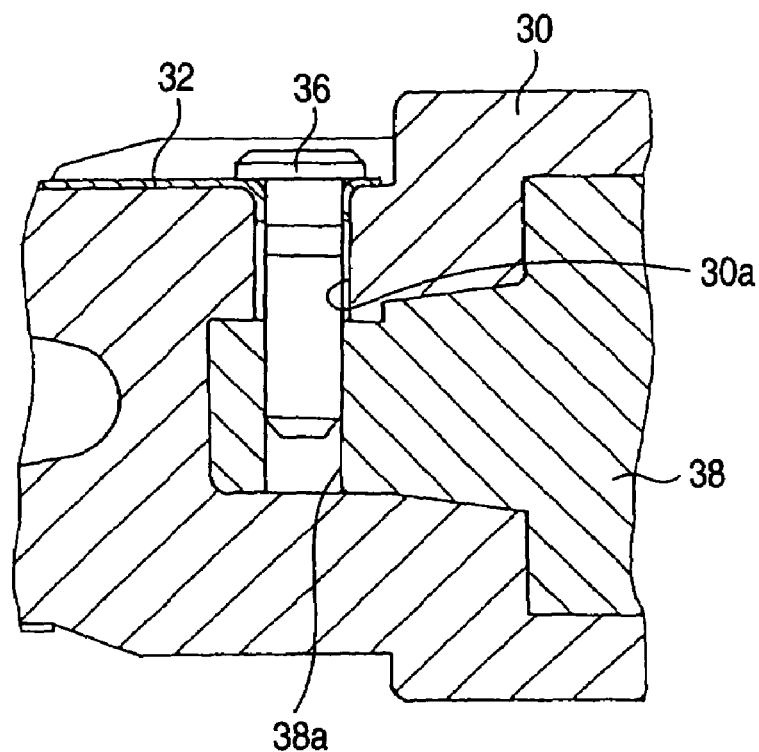
FIG. 9 is an enlarged section view showing how to establish the electrical connection to the antenna element of FIG. 7.

Next, a second embodiment of the invention will be described with reference to FIGS. 7 to 9.

An antenna element 32 formed of a conductive foil is formed in a meander shape, and provided with an electrical contact part 32a at its one end. This electrical contact part 32a has three slits 32b which intersect at an equal angle to one another. A cover tape 32c is provided so as to avoid at least the electrical contact part 32a. This antenna element 32 is adhered and fixed to an outer peripheral face of a core member 30 in a columnar shape, and the electrical contact part 32a is adhered and fixed to the outer peripheral face of the core member 30 in an intermediate part thereof.

The core member 30 is provided with a hole 30a at a position where this electrical contact part 32a has been adhered and fixed, and the hole 30a is extended to reach a power supply terminal 38 which is integrally molded with the core member 30. The power supply terminal 38 is provided with a hole 38a having a smaller diameter than the hole 30a and coaxial with the hole 30a.

In the same manner as in the first embodiment, after portions around the slits 32b are folded so as to be adhered and fixed to an inner peripheral face of the hole 30a, a conductive pin 36 is inserted into the hole 30a. As shown in FIG. 9, this conductive pin 36 clamps the antenna element 32 at the opening end of the hole 30a thereby to establish electrical connection, and a tip end of the conductive pin 36 is press-fitted into the hole 38a formed in the power supply terminal 38 thereby to electrically connect the conductive pin 36 to the power supply terminal 38. In this manner, the antenna element 32 and the power supply terminal 38 can be electrically connected by way of the conductive pin 36.

Figure 10:
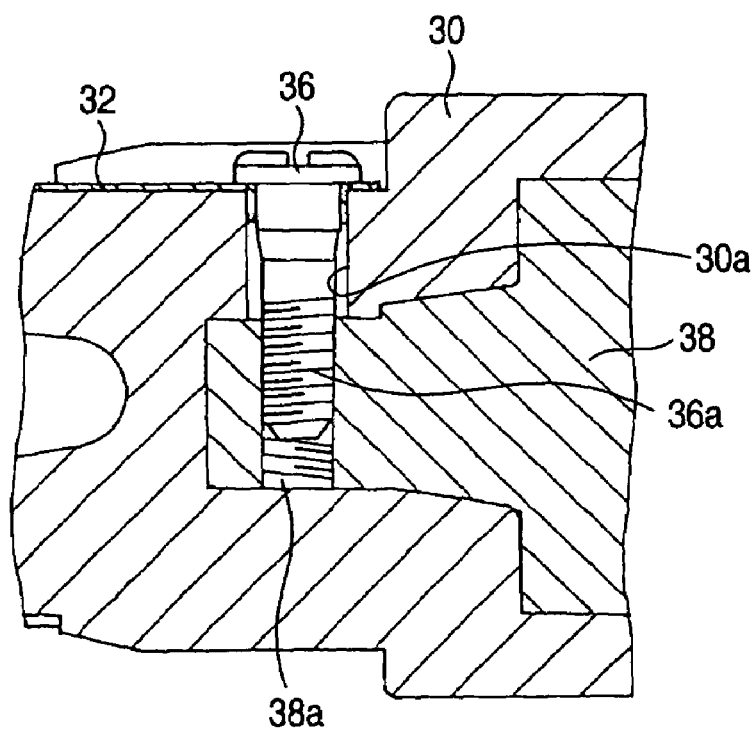
FIG. 10 is an enlarged section view of a modified example of the antenna structure of FIG. 7.

FIG. 10 shows a modified example of the antenna structure of the second embodiment.

In this example, a male thread 36a is engraved at the tip end portion of the conductive pin 36, and a female thread 38b is engraved on an inner peripheral face of the hole 38a in the power supply terminal 38. The conductive pin 36 is press-fitted into the hole 30a of the core member 30, and the male thread 36a of the conductive pin 36 is screwed with the female thread 38b of the power supply terminal 38, so that the electrical contact part 32a of the antenna element 32 is clamped between the conductive 36 and the opening end of the hole 30a to establish the electrical connection.

Figure 11A:
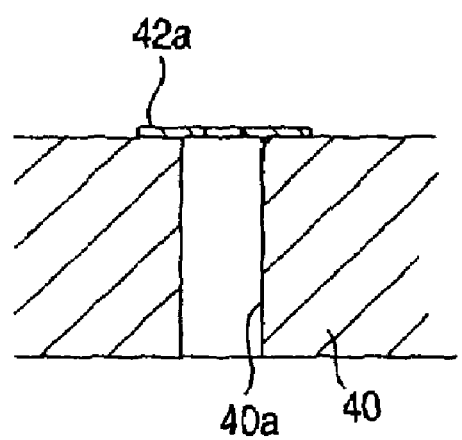
FIG. 11A is a section view of an antenna element in an antenna structure according to a third embodiment of the invention.
Figure 11B:
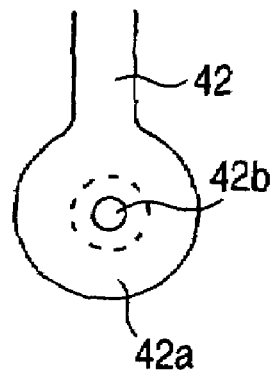
FIG. 11B is a plan view of the antenna element of FIG. 11A.
Figure 12:
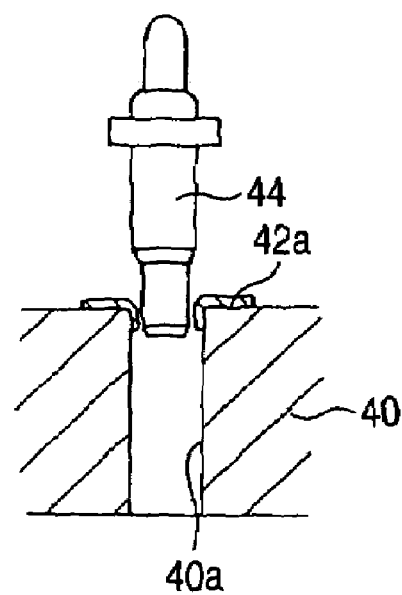
FIGS. 12 and 13 are section views showing how to establish the electrical connection to the antenna element of FIG. 11A.
Figure 13:
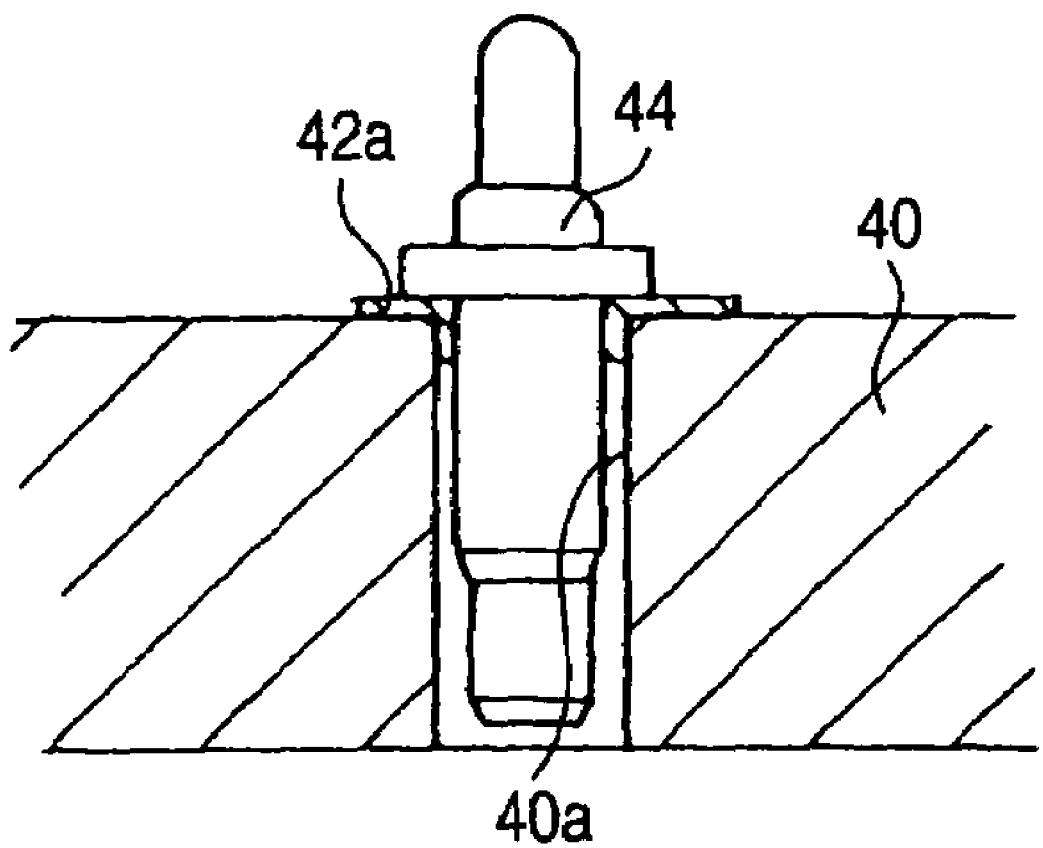
Figure 14A:
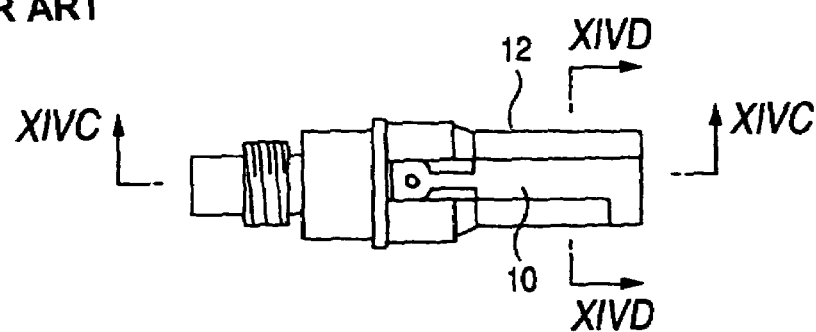
FIG. 14A is a side view of a first related-art antenna structure.
Figure 14B:
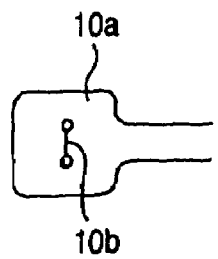
FIG. 14B is an enlarged plan view of an antenna element in the antenna structure of FIG. 14A.
Figure 14C:
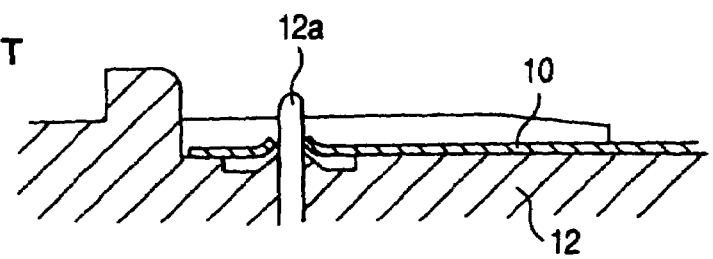
FIG. 14C is a section view taken along a line XIVC—XIVC in FIG. 14A.
Figure 14D:
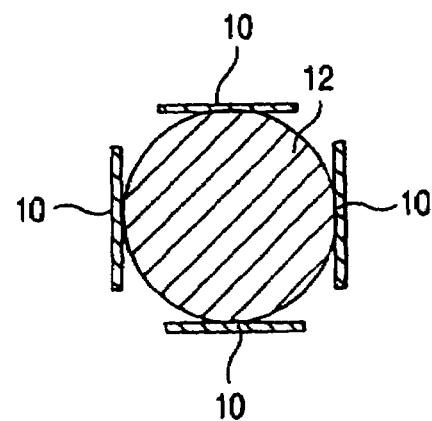
FIG. 14D is a section view taken along a line XIVD—XIVD in FIG. 14A.
Figure 15A:
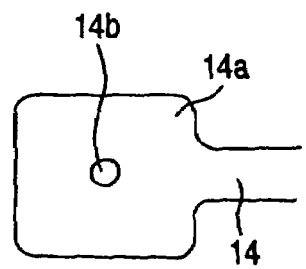
FIG. 15A is an enlarged plan view of an antenna element in a second related-art antenna structure.
Figure 15B:
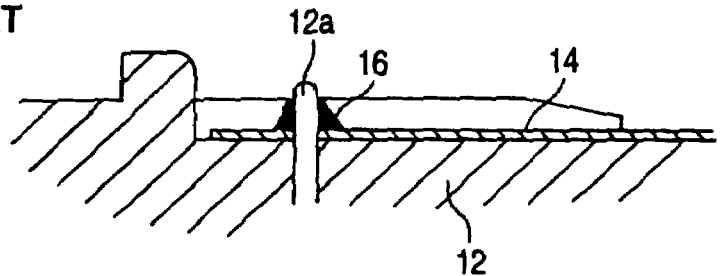
FIG. 15B is a section view of an electric contact part in the antenna structure of FIG. 15A.

Next, a third embodiment of the invention will be described with reference to FIGS. 11 to 13.

In this embodiment, an antenna element 42 formed of a conductive foil is adhered and fixed to a carrier 40 formed of a dielectric body. The carrier 40 is provided with a hole 40a at a position where an electrical contact part 42a of the antenna element 42 is adhered and fixed. The electrical contact part 42a as shown in FIG. 11 is provided with an aperture 42b so as to be opposed to the hole 40a. Then, as shown in FIG. 12, the electrical contact part 42a is folded into the hole 40a by an outer peripheral face of a spring connector 44, and adhered to an inner peripheral face of the hole 40a. Thereafter, the spring connector 44 is press-fitted into the hole 40a, as shown in FIG. 13, and the folded portion of the electrical contact part 42a is clamped between the inner peripheral face of the hole 40a and the outer peripheral face of the spring connector 44, thereby to obtain the electrical connection.

In the first and second embodiments, the number of slits 22b, 32b may be arbitrary. Alternatively, an aperture may be formed in place of the slits, as in the third embodiment. Further, the electrical contact part need not be formed with the slits nor the aperture in advance, but an aperture may be appropriately opened in the conductive foil by pushing the conductive pin 26, 36, the jig 24 or the spring connector 44 through the conductive foil, so that the electrical contact part may be folded into the hole 20a, 30a, 40a. In this case, in a case where a tip end of the jig 24 is in a pyramidal shape, the slits corresponding to a crest of the pyramidal shape can be made in the conductive foil.

Although the outer peripheral face of the spring connector 44 is press-fitted into the hole 40a of the carrier 40 in the third embodiment, the conductive pin may be press-fitted into the hole 40a. Alternatively, a tubular member formed of conductive material as a conductive pin may be press-fitted into the hole 40a of the carrier 40, and then, the spring connector 44 may be press-fitted into this tubular member. Further, the spring connector in place of the conductive pin 26, 36 may be press-fitted into the hole 20a, 30a in the first and second embodiments, while the conductive pin in place of the spring connector 44 may be press-fitted into the hole 40a in the third embodiment. It is also apparent that the electrical contact part 22a, 32a, 42a of the antenna element 22, 32, 42 may be adhered and fixed to any place of the core member 20, 30 or the carrier 40.

What is claimed is:

1. An antenna, comprising:
    an insulative member formed with a hole;
    an antenna element provided as a conductive foil adhered onto the insulative member and having a contact section opposing to the hole; and
    a conductive member fitted into the hole while piercing through the contact section of the antenna element such that a part of the contact section is clamped between an outer face of the conductive member and an inner face of the hole.

2. The antenna as set forth in claim 1, wherein the insulative member is a cylindrical core member of the antenna.

3. The antenna as set forth in claim 1, wherein the insulative member is a dielectric carrier of the antenna.

4. The antenna as set forth in claim 1, wherein the conductive member is a pin member.

5. The antenna as set forth in claim 1, wherein the conductive member is a spring connector.

6. The antenna as set forth in claim 1, wherein the part of the contact section of the antenna element is adhered onto the inner face of the hole.

7. The antenna as set forth in claim 1, wherein a slit through which the conductive member pierces the contact section of the antenna element is formed in the contact section in advance.

8. The antenna as set forth in claim 1, wherein an aperture through which the conductive member pierces the contact section of the antenna element is formed in the contact section in advance.

9. The antenna as set forth in claim 2, wherein the hole extends in parallel to an axial direction of the cylindrical core member.

10. The antenna as set forth in claim 2, wherein the hole extends perpendicularly to an axial direction of the cylindrical core member.

11. A method of manufacturing an antenna, comprising steps of:
    providing an insulative member formed with a hole;
    adhering an antenna element having a contact section onto the insulative member such that the contact section opposes to the hole;
    folding a part of the contact section of the antenna element into the hole; and
    fitting a conductive member into the hole while piercing through the contact section of the antenna element such that the part of the contact section is clamped between an outer face of the conductive member and an inner face of the hole.

12. The manufacturing method as set forth in claim 11, wherein the part of the contact section of the antenna element is folded by an external jig.

13. The manufacturing method as set forth in claim 11, wherein the part of the contact section of the antenna element is folded by the conductive member.

14. An antenna, comprising:
    an insulative core member formed with a hole inside the insulative core member at an end thereof;
    an antenna element provided as a conductive foil adhered to side surfaces of the insulative core member to surround the hole;
    a contact section electrically connected to the antenna element and disposed on the end surface of the insulative core member and side surfaces of the hole inside the insulative core member; and
    a conductive member fitted into the hole such that a portion of the contact section is clamped between the conductive member and the side surfaces of the hole.

15. The antenna as set forth in claim 14, wherein the insulative core member is a dielectric carrier of the antenna.

16. The antenna as set forth in claim 14, wherein the conductive member is a pin member.

17. The antenna as set forth in claim 14, wherein the conductive member is a spring connector.

18. The antenna as set forth in claim 14, wherein the conductive member further contacts the contact section on the end surfaces of the insulative core member.

* * * * *